United States Patent [19]
Flannigan et al.

[11] 4,090,251
[45] May 16, 1978

[54] BUBBLE MEMORY REDUNDANCY STORAGE

[75] Inventors: James Steven Flannigan, Houston; Dennie Joel Shadrick, Stafford; Bennett Sanford Scott, Houston, all of Tex.

[73] Assignee: Texas Instruments Incorporated, Dallas, Tex.

[21] Appl. No.: 804,979

[22] Filed: Jun. 9, 1977

[51] Int. Cl.² ............................................ G11C 19/08
[52] U.S. Cl. ........................................ 365/1; 365/12; 365/15
[58] Field of Search ................................ 340/174 TF

[56] References Cited

U.S. PATENT DOCUMENTS 3,792,450  2/1974  Bogar et al. ................... 340/174 TF

FOREIGN PATENT DOCUMENTS 2,307,332  5/1976  France ........................... 340/174 TF Primary Examiner—James W. Moffitt
Attorney, Agent, or Firm—James T. Comfort; Rene' E. Grossman; James J. Elacqua

[57] ABSTRACT

A magnetic bubble domain memory device is provided that includes a magnetic domain data chip having a major-minor loop organization with on-chip firmware providing redundancy information enabling the use of the chip even though one or more defective minor loops may be present thereon. The first page written in the minor loops, where a page is defined as a common bit position in each of the plurality of minor loops, presents a series of magnetic domains and voids where the magnetic domains represent the operable minor loops and the voids represent the defective minor loops. The second page in the minor loops is a series of magnetic domains and voids separated into bytes of information which are representative of the loop numbers of defective minor loops on the chip, and a third page in the minor loops is a repetition of the first page of data. Collectively, the three pages comprise the on-chip firmware providing redundancy information. This magnetic domain structure is capable of screening out defective minor loops in the read and write operations, and enables synchronization of the magnetic domain device such that a selected page of data may be readily accessed from the plurality of minor loops when desired.

8 Claims, 5 Drawing Figures

BUBBLE MEMORY REDUNDANCY STORAGE

BACKGROUND OF THE INVENTION

The present invention pertains to a defect-tolerant magnetic domain memory device and more particularly to a magnetic domain chip having a major-minor loop organization with on-chip firmware providing redundancy information enabling the use of the chip even though one or more defective minor loops may be present thereon.

DESCRIPTION OF THE PRIOR ART

In recent years tremendous progress has been made in developing equipment for electronic data processing such that today high speed reliable hardward is available to the data processing designer. The newly developed electronic components, particularly those using integrated circuits, have greatly increased the capacity of modern electronic data processing equipment to process data. As the speed and capacity of processing has increased, the data storage requirements have also increased. At present several different techniques exist for storing large quantities of digital data including punched cards, punched tape, magnetic tape, magnetic drums, magnetic disc, and magnetic cores. In all of these types of storage, with the exception of magnetic cores and their solid state storage counterparts, a relatively long period of time is required for accessing any particular bit of data.

On the other hand, with random access type memories such as provided with magnetic cores and their semiconductor counterparts, any particular bit or word stored in the memory can be retrieved extrenely fast, the time required to read any stored bit of information being only the time required for the electronic circuits to operate. However, increased speed has also resulted in increased costs. As a consequence, considering in general the memories discussed above, the cost per bit of information stored is cheapest with the slowest devices and most expensive with the fastest devices. Accordingly, there has been an effort to develop large capacity memories which are characterized by a large data access time but which are less expensive than magnetic cores and solid state storage configurations.

In this regard, significant interest has developed recently in a class of magnetic devices generally referred to as magnetic domain devices or "magnetic bubbles". These devices are described, for example, in *IEEE Transactions on Magnetics*, Vol. MAG — 5, No. 3 (1969), pp. 544–553, "Application of Orthoferrites to Domain-Wall Devices". These magnetic domain devices are generally planar in configuration and are constructed of materials which have magnetically easy directions which are essentially perpendicular to the plane of the structure. Magnetic properties such as magnetization anisotropy, coercivity, and mobility, are such that the device may be maintained magnetically saturated with magnetization in a direction out of the plane and that small localized single domain regions of magnetic polarization aligned opposite to the general polarization direction may be supported. Such localized regions which are generally cylindrical in configuration represent binary memory bits. Interest in these devices in large part is based on the high density that can be obtained and the ability of the cylindrical magnetic domains to be independent of the boundary of the magnetic material in the plane in which it is formed and hence they are capable of moving anywhere in the plane of the magnetic material to effect various data processing operations.

A magnetic domain can be manipulated by programming currents through a pattern of conductors positioned adjacent the magnetic material or by varying the surrounding magnetic field. As an example, the magnetic domains may be formed in thin platelets having uniaxial anisotropy with the easy magnetic axis perpendicular to the plate comprising such material as rare earth orthoferrites, rare earth aluminum and gallium substituted iron garnets and rare earth cobalt or iron amorphous alloys. Since the magnetic bubbles can be propagated, erased, replicated and manipulated to form data processing operations and their presence and absence detected, these bubbles may be utilized to perform the primary functions vital to memory operation.

Many structural organizations of operable magnetic domains have been disclosed in the literature. One of the most popular is the major-minor memory organization disclosed in U.S. Pat. No. 3,618,054. The major-minor loop memory organization as well as its implementation and operation is well-known in the art. The major-minor loop organization includes a closed major loop which typically is established by an arrangement of T-bar permalloy circuits on, for example, a rare earth orthoferrite platelet. The magnetic domains are propagated around the loop by in-plane rotating magnetic field action. The major loop is generally elongated to permit a number of minor loops to be aligned along side it. Two way transfer gates permit the transfer of magnetic domains from the minor loop to the major loop and from the major loop to a minor loop. Further access to the major loop is achieved by a detect and read connection thereto and by a separate write connection.

The organization above described permits a synchronized domain pattern since propagation in the loops is synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together. It is common to arrange such data chips in rows and then even to stack rows of data chips in time multiplexed layers to achieve complex memory structures, the data domains in all the loops and all the chips being synchronized with in-plane rotations.

Typically, all of the minor loops in the chip, upon command, transfer in parallel the bubbles from their corresponding positions to the major loop. The bubbles are then serially detected as they are propagated past a read position. New data may also be inserted at a write position for parallel transfer back into the minor loops at an appropriate time later (when major loop magnetic domain propagation aligns the data for transfer).

Simultaneous reading/writing of data into a grouping of related major loops gives the capacity of treating related magnetic domains as digital or other coded words. Time multiplexed groups of data chips permits reading and writing of data in a time sharing fashion to permit an overall memory data rate greater than that permitted by magnetic domain propagation in a single chip.

Another structural organization of operable magnetic domains is the block replicate organization, also well known in the art. This organization is presented in an article appearing in *AIP Conference Proceedings on Mag-*

*netism and Magnetic Materials,* No. 29 (1975), pp. 51–53, entitled "64K Fast Access Chip Design". The block replicate organization includes open ended major propagation paths which may be established by an arrangement of T-bar permalloy circuits on, for example, a rare earth orthoferrite platelet. These major propagation paths are aligned adjacent to a plurality of minor loops. Data is written into the minor loops from a major propagation path by way of a swap transfer gate. Old data is transferred into the major propagation paths by a swap signal received from a controller chip and is ultimately annihilated. A subsequent swap signal transfers new data into the minor loops where it becomes non-volatile. To read data out of the minor loops in a block replicate organization it is necessary to read out the magnetic domains onto separate major propagation paths. A replicate gate between the minor loops and the major propagation paths allows the stored data to remain within the minor loops with the data that is read out onto the major propagation path being a replicated version of the stored data. The major distinction between a block replicate organization and a major-minor loop organization is that the data stored within the minor loops remains in the minor loops during the read operation mode in a block replicate while the stored data is transferred completely out onto a major propagation path before replication to a user system in a major-minor loop organization. Also since it is not physically possible to locate the minor loops so as to take advantage of all locations on the major propagation paths, the rate of bubble movement within the respective minor loops is greater than that possible at the detector. In order to overcome this physical disability, the major propagation paths in the block-replicate organization at the output for the reading of the minor loops are merged. Making one major propagation path shorter by one position as compared to another major propagation path allows a merger of the two paths with one path complementing the voids present in the other path. The result of the merger is to double the data rate out of the minor loops to the detector making it equal to the rate within the minor loops.

In both the block replicate organization and the major-minor loop organization, unless special provision is made, every loop in every chip of the system must be perfect for the system to perform satisfactorily. Since chips contain entire groupings of registers, a defect in one of the minor loops would require discarding the entire chip. Various techniques have been proposed in the art for permitting the use of a magnetic domain chip even though one or more of its minor loops may be defective. Exemplary techniques are described, for example, in U.S. Pat. No. 3,908,810 entitled "Bubble Memory Minor Loop Redundancy Scheme", which is assigned to the assignee of the present invention and "Fault-Tolerant Memory Organization: Impact on Chip Yield and System Cost", *IEEE Transactions Magnetics,* September, 1974. These techniques utilize separate magnetic domain chips to store locations of defective loops. A further example of a technique to overcome this deficiency is found in pending U.S. patent application Ser. No. 594,901 filed July 10, 1975 entitled "Magnetic Domain Minor Loop Redundancy Scheme" also assigned to the assignee of the present invention. The technique described therein is an important step in development of a system using data chips with defective minor loops. Generally, what is disclosed therein is the use of a non-volatile semiconductor memory, such as a programmable read-only memory, to store data identifying the relative positions of defective minor loops to each other. This data is used to control logic so that a stream of data bubbles to be transferred into the minor loops for storage, for example, contains intermittent voids corresponding to defective minor loop locations. This latter technique is especially beneficial for storing redundancy data designating defective minor loops in a series of magnetic bubble data chips in a magnetic bubble domain system. A further improvement on this technique is found in pending U.S. patent application Ser. No. 752,947 filed Dec. 17, 1976, entitled "Bubble Redundancy Map Storage Using Non-Volatile Semiconductor Memory" which is also assigned to the assignee of the present invention. This improvement provides for the redundancy data to be stored in an erasable non-volatile semiconductor memory to facilitate magnetic bubble data chip replacement without having to replace the entire array of redundancy data for all data chips within a magnetic domain system.

A further problem found in accessing stored data from a magnetic domain system is the requirement to know at any time the location of specific data stored within the minor loops. In order to be able to locate this data, it is necessary to know when the input or output absolute address in the minor loop and page address in the minor loop containing the data coincide. The minor loop is partitioned into a number of positions capable of supporting and storing magnetic domains, these positions being the absolute addresses of the minor loop. However, the nature of the magnetic domain device is to move individual magnetic domains through each of the positions of the minor loop, and thus each magnetic domain has a page address it retains as it propagates through each absolute address. The absolute address nearest the swap transfer gate may be designated as the input absolute address, while the absolute address nearest to the replicate gate may be designated as the output absolute address. When a user asks for a specific piece of data, although the page address for the data is known, in order to read it out the user must also know at which absolute address it is located so that a control signal can move that page to the appropriate absolute address.

An alternative scheme for providing redundancy patterns for screening defective minor loops comprises storing said redundancy pattern on the data chip itself. An example of this technique can be found in pending U.S. patent application Ser. No. 767,852 filed Feb. 11, 1977, entitled "Magnetic Bubble Memory Chip Synchronization and Redundancy" which is also assigned to the assignee of the present invention. This technique provides for storing a redundancy pattern and a synchronization pattern in a minor loop set aside specifically for this purpose. This data is accessed by the user and used to screen out defective minor loops that are labeled in the redundancy pattern. At a point in time when a predetermined synchronization pattern is found, the user then is capable of accessing any page knowing the absolute address of the present available page. This technique, however, requires the dedication of an entire minor loop to storing the synchronization and redundancy patterns.

A later pending U.S. patent application Ser. No. 796,934 filed June 16, 1977, entitled "Redundancy Map Storage For Bubble Memories", which is also assigned to the assignee of the present invention demonstrates placing the redundancy map in one page of the minor loops. The redundancy map comprises firmware wherein the presence of a magnetic bubble domain within the designated page at a specified bit position identifies the particular minor loop corresponding to that bit position as a good loop, and conversely the absence of a bubble within the page at a specified bit position identifies the particular minor loop corresponding to that bit position as a defective loop.

SUMMARY OF THE INVENTION

A preferred magnetic domain memory system in accordance with the present invention includes a data chip having a major loop, a plurality of minor loops, and transfer gates therebetween. The major-minor loop chip concept is applicable to all memories comprised of multiple data loops which communicate with serial input/output tracks at at least one point on each data loop. Pulse conductor means are used to transfer the magnetic domains through the transfer gates on command. Each data chip may contain one or more faulty or defective minor loops and still be an effective memory if the defective loops are properly identified. A redundancy loop pattern is stored in the first page of the plurality of minor loops, in the form of a series of magnetic domain where the presence of a magnetic domain designates only those loops that are capable of propagating magnetic domains. A second redundancy pattern is stored in the second page of the plurality of minor loops in the form of loop numbers designating those minor loops that are incapable of propagating magnetic domains. A third redundancy pattern is stored in the third page of the plurality of minor loops in a form identical with that of the first page.

A method of reading the redundancy patterns stored in the plurality of minor loops to insure their accuracy comprises reading and evaluating the first three pages of the plurality of minor loops to evaluate those pages for a predetermined sequence of magnetic domains. In response to finding any two pages within the first three pages of the plurality of minor loops to correspond in data information, the third page of redundancy data if defective will then be regenerated accordingly. A further method using the stored redundancy pattern for synchronizing the magnetic domain device comprises reading the first available page of data and determining whether it contains the predetermined sequence of magnetic domains, comparing that sequence to information found in the next succeeding page and evaluating whether or not that information corresponds to determine whether the first available page was the first page of redundancy data thereby synchronizing the device to an absolute address equal to a specific page address. This evaluation continues until some point in time when the redundancy pattern is found in at least two consecutive pages.

DETAILED DESCRIPTION OF THE DRAWINGS

Figure 1:
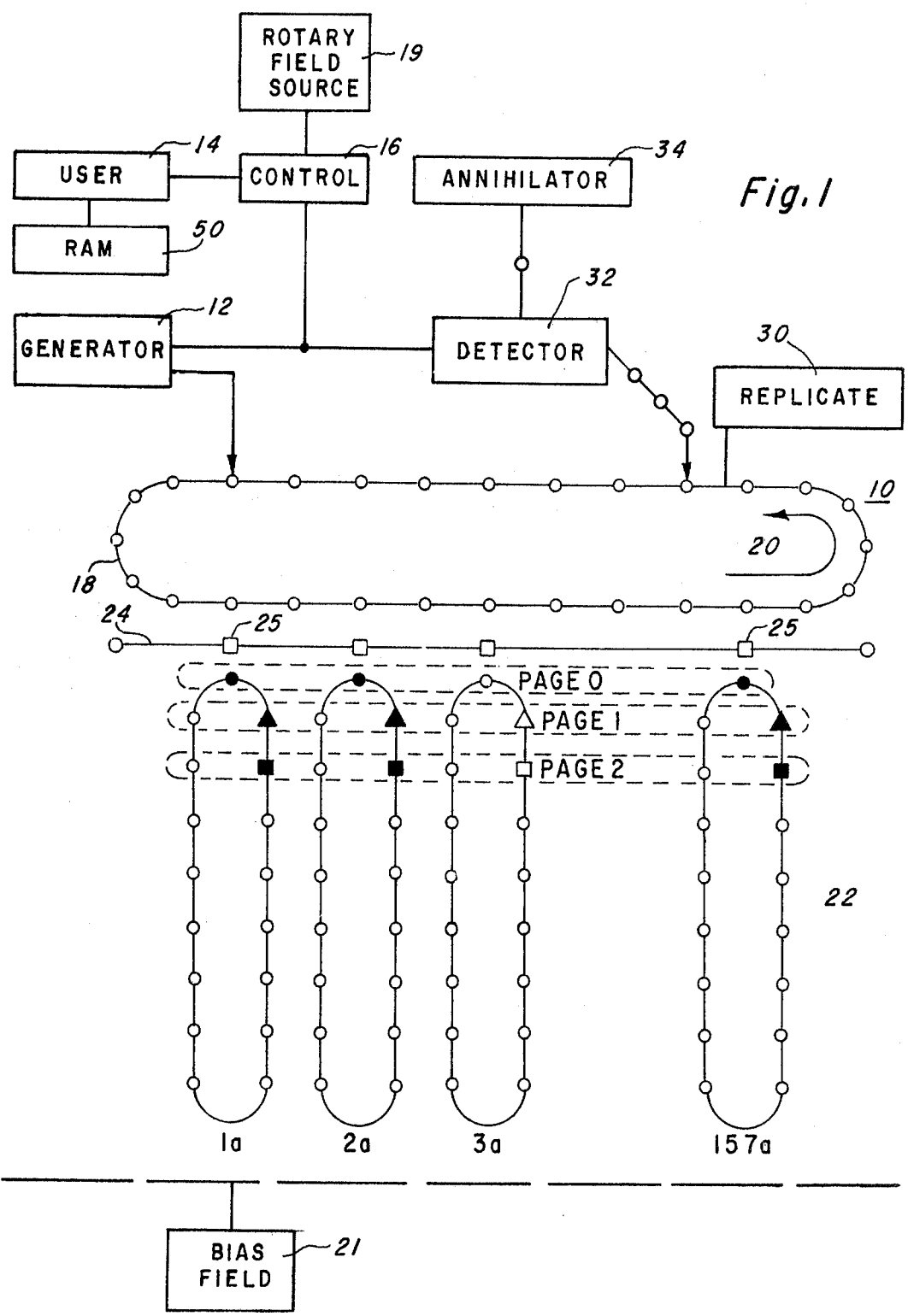
FIG. 1 is a diagram partly in block form and partly in schematic form of a data chip employed in a magnetic domain memory system in accordance with the present invention.

Referring now to the drawings and more particularly to FIG. 1, a major/minor loop magnetic domain memory organization 10 is illustrated. In a preferred embodiment shown in FIG. 1 generator 12 receiving instruction from user 14 by way of a control unit 16 will generate magnetic domains onto a major propagation path 18. Control unit 16 may be a controller marketed by Texas Instruments Incorporated, Dallas, Tex., Model TMS 9916. Major propagation path 18 contains a number of positions capable of supporting magnetic domains. Once in the major propagation path 18, magnetic domains are circularly propagated in transfer direction 20 by a rotary in-plane rotating magnetic field, 19. Bubble size is maintained by the bias field 21.

Aligned adjacent to major propagation path 18 are a series of identical minor loops 22. By way of illustration only, the plurality of minor loops 22 comprise 157 minor loops. The number and size of the minor loops are dependent upon the chip capacity needed for any one application. Minor loops 1A-157A are disposed adjacent to major propagation path 18 in a perpendicular fashion and interact with major path 18 through transfer line 24 which contains in a serially connected fashion swap transfer gates 25 for each minor loop.

A transfer pulse is applied to transfer line 24 which causes the magnetic domains or the absence of magnetic domains, which are located on the major propagation path 18, to be exchanged with old data stored in the minor loops 1A-157A. Once transferred to major propagation path 18 the magnetic domains will propagate to a point on the major propagation path 18 where they are replicated, that is split into two sections with one part continuing along major propagation path 18 and the second part propagated along a path leading to a detector 30. Detector 30 will detect the presence or absence of a magnetic domain on that propagation cycle after which the magnetic domain will move to an annihilator 32 which may be in the form of a permanent magnet having a polarity different from that of the magnetic domains and thus absorbing them.

Magnetic domains are located within the minor loops 1A-157A at fixed storage locations, or addresses. A page of information can be defined as a series of magnetic domains and voids read simultaneously onto the major propagation path 18 from an identical address on each of the minor loops 1A-157A. The first three pages of data stored in minor loops 1A-157A, i.e. page 0, page 1, and page 2, represent redundancy data information. The darkened circles, triangles, and squares represent magnetic bubble domains present in pages 0, 1 and 2 respectively. Page 0 represents a series of magnetic domains and voids having magnetic domains in only those loops that are operable, that is, capable of propagating magnetic domains around the minor loop. As shown in FIG. 1, minor loop 3A does not have a magnetic domain present in its first data position closest to transfer line 24, i.e. there is shown an empty circle. FIG. 1 illustrates that minor loop 3A is defective and incapable of propagating magnetic domains in a fashion necessary to insure proper data response.

Page 1 is a series of magnetic domains and voids representing the locations of those minor loops that are defective. In the present embodiment shown in FIG. 1 where 157 minor loops are illustrated page 1 is separated by the user 14 into 13 bytes of data which represent bad loop numbers. Although the information found in page 1 is similar to page 0, i.e. designating bad loops, the format is different. In page 1 at the location of a defective loop will be a void since no magnetic bubble domain can be present. The user must recognize in formulating bytes of information that the void is present only because of a bad loop and not as part of the binary number designating a bad loop number. To do this the redundancy pattern found in either pages 0 or 2 are used to screen the bad loop and allows the user to formulate the byte using only operable loops. Therefore, the same void will appear in the same virtual bit position of pages 0, 1, and 2 for a defective loop. Page 2 is a series of magnetic domains and voids identical in form to that sequence of magnetic domains found in page 0.

Operationally, user 14, which may be in the form of a microprocessor such as that marketed by Texas Instruments Incorporated, Dallas, Tex., Model No. TMS 9980, will utilize magnetic bubble memory device 10 having the firmware limitations found in pages 0-2 of minor loops 1A-157A. The redundancy patterns found in the first three pages of the plurality of minor loops 22 are used by user 14 to insure that data is not read from or written into an inoperable minor loop such as minor loop 3A shown in FIG. 1.

Figure 2:
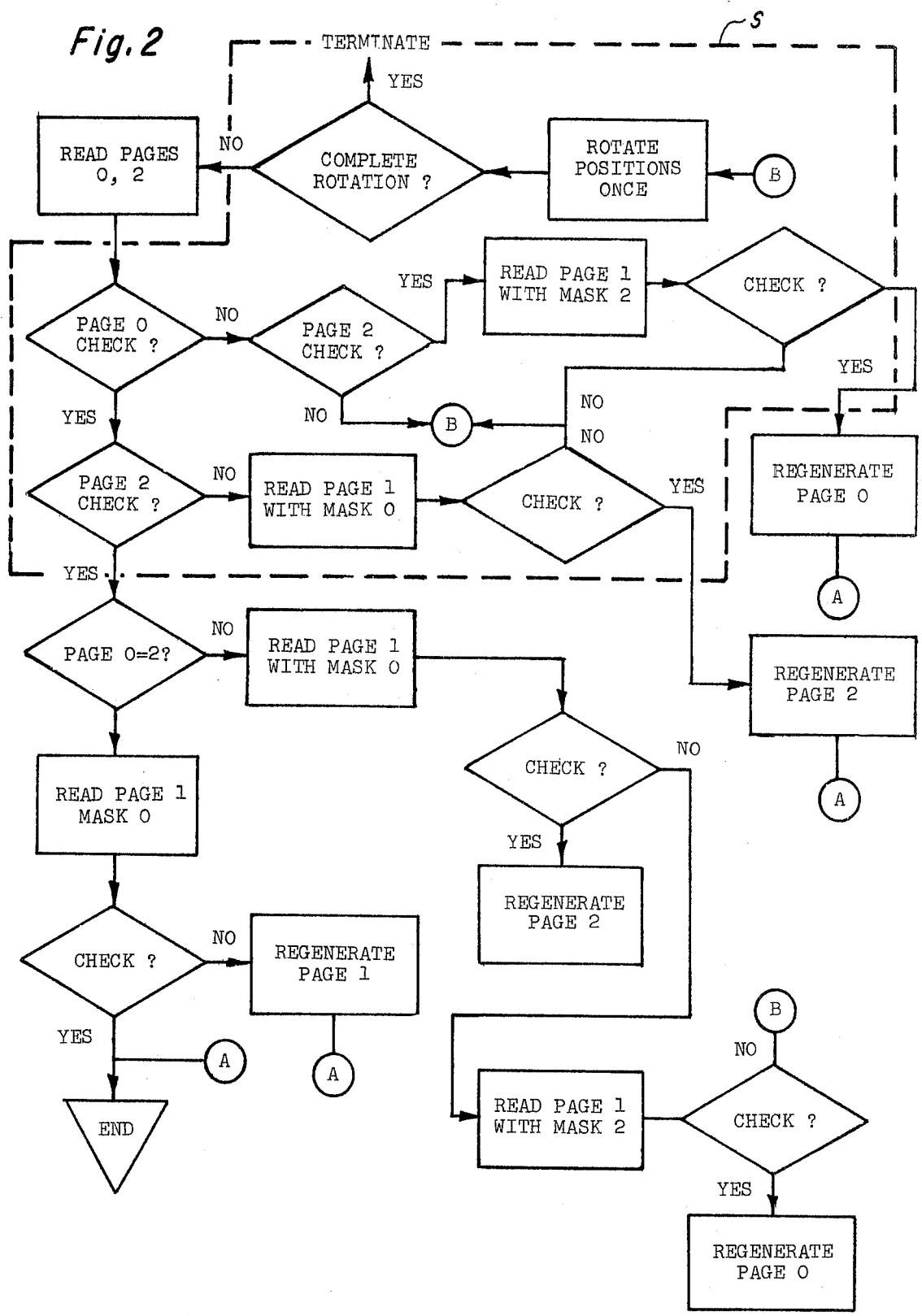
FIG. 2 is a block diagram in the form of a flow chart illustrating a method of accessing redundancy data and a method of using redundancy data stored within a plurality of minor loops for synchronizing a magnetic domain memory device in accordance with the present invention.

Referring now to FIG. 2 of the drawings, where a block diagram in the form of a flow chart illustrates a method of accessing the redundancy data stored in pages 0-2 of the magnetic domain memory device 10 found in FIG. 1.

In evaluating the redundancy data stored in the minor loop array 22 of FIG. 1, it is first necessary to determine whether any alterations have been made to that stored information. In order to properly utilize these three pages of information it must be found that at least two of the three pages have corresponding information relating to the inoperable minor loops in a data chip. One method of determining whether or not two of the three pages do correspond comprises first reading pages 0 and 2 by a user system as described in relation to the magnetic bubble domain device 10 of FIG. 1. The user system 14 must then evaluate whether or not there is present in that first page of information a predetermined sequence of magnetic domains and voids. In the magnetic domain device illustrated in FIG. 1, 144 magnetic bubble domains must be found to satisfy the requirement that there be a maximum of 13 defective or inoperable minor loops, for example. If this condition is found to be true, then the third page of information is evaluated in the same manner for the predetermined sequence of magnetic domains and voids. If, however, the first page does not fulfill the requirement of 144 magnetic domains, the third page is evaluated and if found to fulfill the condition the second page is read using the mask of the third page stored in RAM 50. The user then makes a comparison of the third page of information with the information stored in the second page which is in the form of bad loop locations. When both pages 0 and 2 fail to fulfill the condition, then the user resorts to a method of synchronization to locate the redundancy pattern, this method is discussed below. If page 1 and page 2 correspond in information then based upon the mask found in page 2, page 0 will be regenerated. A similar sequence of events will occur when page 2 is found to be defective in form and page 0 and 1 are found to correspond, page 2 will then be regenerated in like manner.

If the user in evaluating pages 0 and 2 find them to be identical then page 1 is then read using either the mask of pages 0 or 2 and compared with the information found in either of those pages. If the information in page 1 is found to correspond then a signal is raised to the user 14 that the redundancy data is in proper form. If not page 1 is regenerated to complete the redundancy data pattern. If, however, pages 0 and 2 both satisfy the condition of a predetermined sequence of magnetic domains but are not equal to each other each of those pages is used as a mask to read page 1 and compared with page 1 to determine the defective page. If neither page agrees with the information of page 1 a termination signal is raised. Thus before the user 14 will read or write from a magnetic domain memory device illustrated in FIG. 1 this method of accessing and comparing the redundancy patterns stored in the first three pages of the minor loop insures the credibility of that data.

In order for a user system 14 as illustrated in connection with FIG. 1 to properly read from and write to a magnetic memory device, it is necessary for that user to synchronize the magnetic memory device such that it has a fix on what page of information is at present in the absolute address nearest a transfer device. A method for synchronization capable of fulfilling these requirements is suggested by the magnetic memory device 10 in FIG. 1 and is illustrated in the block diagram of FIG. 2 section S. Upon discovering a failure mode which can be in the form of a power failure in connection with a magnetic bubble memory device or at an initialization point synchronization is a necessary function. A method of accomplishing this function may revolve around determining whether the pages storing the redundancy patterns are in order, that is, having the second page of data representing the bad loop locations to be between two pages of data having a predetermined sequence of magnetic domains and voids. A first step in accomplishing this method is for the user to read the first available page and determine if that page has the required sequence of magnetic domains. If it does not meet this condition then it will proceed through an iterative reading of all the pages in the magnetic bubble memory device until such a point in time where the condition is fulfilled. If the first available page fulfills the condition of having the predetermined sequence of magnetic domains and voids the user will then read the next succeeding page of information from the minor loops using the mask from the previous page and compare that page with the information found in the first available page of data. If the second page of information and the first available page correspond such that the second page is representative of the locations of the inoperable minor loops so that the user is reading the pages in a sequence from 0 to page 2 to obtain a redundancy pattern then a synchronization signal may be raised and the method of determining the accuracy of the redundancy data can continue.

While the present invention has been described in relation to specific embodiments, and methods, it should be apparent to those skilled in the art that various modifications may be made without departing from the spirit and the scope of the present invention.

What is claimed is:

1. In a magnetic domain memory device, the combination comprising:
   a thin magnetic film suitable for use in the propagation of magnetic domains;

means disposed on said magnetic film for defining a major path for propagating magnetic domains, a plurality of minor loops adjacent said major path, with one or more of said minor loops being defective; and means for transferring said magnetic domains between said major path and said minor loops; and firmware means for inhibiting the use of said defective minor loops including a first page of data disposed in a common bit position in each of said minor loops and comprising a series of magnetic domains and voids where the location of a magnetic domain represents an operable minor loop and the absence of magnetic domain represent a defective minor loop, a second page of data disposed in a common bit position in each of said minor loops and comprising a series of magnetic domains and voids representing the loop numbers of said defective minor loops, and a third page of data disposed in a common bit position in each of said minor loops and comprising a series of magnetic domains and voids identical with said first page of data.

2. A magnetic domain memory device as set forth in claim 1, further including detector means for sensing the presence or absence of magnetic domains, and generating means for writing new magnetic domains, said generating means and said detector means being connected to said major path.

3. A magnetic domain memory device comprising:

a thin magnetic film suitable for use in the propagation of magnetic domains;

means defining a magnetic domain propagation pattern on said film of magnetic material organized into a major loop and a plurality of minor loops, and major loop being positioned adjacent to and operably associated with said plurality of minor loops with one or more of said minor loops being defective, transfer means for moving said magnetic domains between said major loop and said plurality of minor loops, means operably associated with said major loop for generating magnetic domains in introducing new data into said major loop, means for detecting the presence of magnetic domains connected to and operably associated with said major loop, replicate means operably associated with said major loop for splitting said magnetic domain into two separate magnetic domains one of which is transferred to said detecting means and the other of which is propagated in said major loop, and annihilate means operably associated with said detecting means for destroying magnetic domains after detection, means for inhibiting the use of said defective minor loops including:

a first page of data disposed in a common bit position in each of said minor loops and comprising a series of magnetic domains and voids where the magnetic domains are representative of operable minor loops and the voids are representative of defective minor loops, a second page of data disposed in a common bit position in each of said minor loops and comprising a series of magnetic domains and voids representative of the loop numbers of the defective minor loops, and a third page of data disposed in a common bit position each of said minor loops and comprising a series of magnetic domains and voids identical to said first page of data.

4. A magnetic domain memory device as set forth in claim 3, wherein said first, second, and third pages of data comprise consecutive common bit positions within each operable minor loop.

5. A magnetic domain memory device as set forth in claim 3, wherein said annihilate means comprises a permanent magnet having a polarity opposite to the polarity of said magnetic domains.

6. A method of accessing on-chip redundancy data to insure data credibility for a magnetic domain memory device having a major propagation path operably aligned with a plurality of minor loops of which at least one is defective, comprising: reading and evaluating the first three pages of said plurality of minor loops for a predetermined sequence of magnetic domains and voids, and signaling a user that redundancy data is in order while regenerating any page found to be defective in response to a finding that any two pages of said first three pages correspond in the information stored therein.

7. A method of accessing on-chip redundancy data to insure data credibility for a magnetic domain memory device having a major propagation path operably aligned with a plurality of minor loops of which at least one is defective, wherein the redundancy data is provided in first, second, and third pages respectively defined by corresponding common bit positions in each of said plurality of minor loops and identifying good and defective minor loops, said method comprising:

reading the first and third pages of said plurality of minor loops, evaluating said first and third pages of data for a predetermined series of magnetic domains and voids, reading the second page of data using the mask of the third page in response to finding said predetermined series of magnetic domains and voids only in the first page, evaluating the information designating defective minor loops contained by the second page with the information found in either the first or third pages dependent upon finding the predetermined series of magnetic domains and voids in either of those pages, regenerating said predetermined series of magnetic domains and voids for the first page in response to the second and third pages corresponding in data information, regenerating said predetermined series of magnetic domains and voids for the third page in response to the second and first pages corresponding in data information, comparing the first and third pages of data when said predetermined series of magnetic domains and voids is found in both the first and third pages, reading the second page of data using the mark of the first page of data dependent upon finding the first page of information different from the third page of information, evaluating the second page of information with the first page of information containing the said predetermined series of magnetic domains and voids, regenerating the third page of information dependent upon finding the first and second pages of information to be corresponding, reading the second page of data using the mask of the third page dependent upon finding that the second page and the first page do not correspond, evaluating the second page of information with the third page, regenerating the first page of information dependent upon finding the third and second pages of information to be corresponding, terminating said method for accessing on-chip redundancy data when the first page of information is not equal to the third page of information and the second page of information does not correspond to either the first or third pages, reading the second page of information and the first page of information in response to finding that the said first and third pages of information have the same predetermined series of magnetic domains and voids, evaluating the second page of information with said first page of information, regenerating the second page of information dependent upon finding that the second page does not correspond with the first page of information, signaling a user that said redundancy data is intact and suitable for screening defective minor loops in response to finding two out of the first three pages of redundancy data to correspond.

8. A method of synchronizing a magnetic domain memory device having redundancy data stored in the first three pages of a plurality of minor loops operably aligned with respect to a major loop, wherein each of the three pages is respectively defined by corresponding common bit positions in each of said plurality of minor loops, the first page of data containing a series of magnetic domains and voids repectively representative of good and defective minor loops, the second page of data containing a series of magnetic domains and voids representative of the loop numbers of defective minor loops, and the third page of data containing a series of magnetic domains and voids identical with the series of magnetic domains and voids of said first page, said method comprising:

reading and evaluating successive available pages of data from said plurality of minor loops until a predetermined series of magnetic domains and voids is detected on a page, reading the next available page of data and masking the last page of data read dependent upon finding said predetermined series of magnetic domains and voids, evaluating the present page of data information with the previous page of data, and signaling synchronization of said magnetic domain memory device in response to the detection of a predetermined pattern of redundancy data identifying said first three pages in said plurality of minor loops.

* * * * *